United States Patent
Chien et al.

(10) Patent No.: US 6,921,493 B2
(45) Date of Patent: Jul. 26, 2005

(54) METHOD OF PROCESSING SUBSTRATES

(75) Inventors: Ann Chien, Taipei (TW); Brett C. Richardson, San Ramon, CA (US); Sterling M. Goyer, Pleasanton, CA (US)

(73) Assignee: Lam Research Corporation, Fremont, CA (US)

( * ) Notice: Subject to any disclaimer, the term of this patent is extended or adjusted under 35 U.S.C. 154(b) by 140 days.

(21) Appl. No.: 10/141,638

(22) Filed: May 6, 2002

(65) Prior Publication Data

US 2002/0192957 A1 Dec. 19, 2002

Related U.S. Application Data

(60) Provisional application No. 60/293,805, filed on May 24, 2001.

(30) Foreign Application Priority Data

Nov. 13, 2001 (TW) .......... 90128123 A

(51) Int. Cl.$^7$ .......... C23F 1/00; H01L 21/00
(52) U.S. Cl. .......... 216/67; 216/13; 216/77; 134/1.1; 438/710
(58) Field of Search .......... 216/13, 67, 77; 134/1.1; 438/710

(56) References Cited

U.S. PATENT DOCUMENTS

| 6,177,353 | B1 * | 1/2001 | Gutsche et al. ............. 438/704 |
| 6,617,794 | B2 * | 9/2003 | Barnes et al. ............ 315/111.21 |
| 2001/0009249 | A1 * | 7/2001 | Kuo et al. .................... 216/72 |
| 2001/0041453 | A1 | 11/2001 | Ohuchi | |

* cited by examiner

Primary Examiner—Shamim Ahmed
(74) Attorney, Agent, or Firm—Lam Research Corporation

(57) ABSTRACT

This invention relates to a method of oxide hardmask aluminum etching in metal dry etch processors. It consists of two steps: the step of dry etching an aluminum interconnect stack by using an etch gas composed mainly of boron trichloride/chlorine/fluoroform/nitrogen, and the step of removing etch remnants by using a vapor plasma. The function of the etch gas is to etch the aluminum interconnection pattern in the semi-conductor, and the function of the water vapor plasma is to prevent the corrosion of a chip during the process of removing etch remnants, which will further reduce water rinsing and solution cleaning as in conventional practice, of water rinsing and solution cleaning after removal of photoresist.

9 Claims, 2 Drawing Sheets

METHOD OF PROCESSING SUBSTRATES

CROSS REFERENCE TO RELATED APPLICATION

This application claims priority of U.S. Provisional Patent Application Ser. No. 60/293,805 filed May 24, 2001 and Taiwanese Patent Application No. 90128123 filed on Nov. 13, 2001.

BACKGROUND OF THE INVENTION

1. Field of the Invention

This invention relates to a method of oxide hardmask aluminum etching in metal dry etch processors. It consists of two steps: the step of dry etching an aluminum interconnect stack (typically TiN) by using an etch gas composed mainly of boron trichloride/chlorine/fluoroform/nitrogen, and the step of removing etch remnants by using a water vapor plasma. The function of the etch gas is to etch the aluminum interconnection pattern in the semiconductor, and the function of the water vapor plasma is to prevent the corrosion of a chip during the process of removing etch remnants, which will further reduce water rinsing and solution cleaning as in conventional practice, of water rinsing and solution cleaning after removal of photoresist.

2. Description of the Related Art

In a conventional metal interconnection method, the metallized and photoresist-coated wafer must first be patterned in order to transfer the interconnection pattern to the photoresist, which is then followed by a dry etch process using chlorine as the primary etch gas to thoroughly remove the metal layer of the chip that is not covered with photoresist.

The remaining photoresist is then removed by dry etching, or wet etching, or both dry etching and wet etching. The next step is to deposit the protected layers of the circuit and components of the chip (passivation). The entire structure of the integrated circuit process will then appear, as shown in the flow chart of FIG. 1.

According to the above process, the conventional aluminum interconnect etching method uses an etch gas composed of chlorine/boron trichloride/nitrogen, or chlorine/boron trichloride/fluoroform. However, due to increased integration and continued shrinking of the line width—for example, to 0.15 mm or less—in semi-conductor components today, the selectivity rate of this etch gas to photoresist and aluminum interconnect stack will not be high enough, thus causing insufficient photoresist to withstand the action of the plasma, which will result in imprecise transfer of patterns. Therefore, the use of conventional photoresist has been gradually replaced by the oxide hardmask. Since there is no photoresist passivation source when using the oxide hardmask, the conventional etch gas made up of chlorine/boron trichloride/nitrogen, or chlorine/boron trichloride/fluoroform—whether it is for controlling the etch remnants or profile—will not be able to generate the precision required by aluminum copper alloy etch in the narrow line width.

Moreover, the current aluminum interconnect etching method, after plasma etching, requires immediate removal of photoresist, Once the photoresist is removed, the chip will be rinsed with water to prevent the corrosion of aluminum copper alloy interconnection by remnants of chlorine and nitrogen. Finally, the wafer needs to be immersed in a cleaning solution to further remove polymers and etch byproducts formed during etching. The wafer has to go through this complicated process before moving into the next processing stage.

In order to overcome the above shortcomings and to simplify the process, this invention introduces a gas formula that works well with the oxide hardmasking method, By taking the advantages of the changes of the major components of the etch gas, this method helps reduce the occurrence of etch remnants and produces better etch profiles. In addition, the invention also uses water vapor plasma during the step of removing etch remnants, which will simplify the complicated process of water rinsing and immersion cleaning after the removal of photoresist, thus allowing the wafer to go directly into the next step for film deposition. As a result, this invention will not only enhance the precision of the transfer of the patterns, but will, due to its simplicity, also shorten production time, reduce production costs, and increase productivity.

SUMMARY OF THE INVENTION

The first objective of this invention is to provide a hardmask aluminum interconnect etch method suitable for metal dry etch processing that can accommodate the needs of components having a line width of 0.15 mm or less.

The second objective of this invention is to provide a good selectivity rate, thus enhancing the precision of the transfer of the etch patterns.

The third objective of this invention is to provide a hardmask aluminum interconnect etching method suitable for dry etch processors that will save the step of water rinsing and solution cleaning the chip, reducing solution consumption, shorten the production time and increase productivity.

To accomplish these objectives, the invention applies oxide hardmask aluminum etching in the metal dry etch processor. It consists of two steps: Step One, the aluminum interconnect etch processing step, uses the etch gas composed mainly of boron trichloride/chlorine-/fluoroform/nitrogen to etch the aluminum interconnection pattern of the semi-conductor and to produce unetched remnants because of the improvement of the components of the etch gas, thus achieving the goal of precise control of the etch profile. Step Two uses a water vapor plasma in the process of removing etch remnants to prevent the corrosion of the wafer by the residual chlorine and nitrogen, which will save the step of immersion cleaning as required in a conventional method after removal of photoresist.

BRIEF DESCRIPTION OF THE DRAWINGS

The present invention will be readily understood by the following detailed description in conjunction with the accompanying drawings, in which like reference numerals designate like structural elements.

| SYMBOLS OF COMPONENTS | | | |
|---|---|---|---|
| 31 | SiON Layer | 32 | Dioxide Silicon Layer |
| 33 | Photoresist Layer | 34 | Titanium Layer |
| 36 | Titanium Nitride Layer | 38 | Aluminum copper alloy Layer |
| 40 | Hardmasking Layer (typically Silicon Dioxide or SiON) | | |

DETAILED DESCRIPTION OF THE PREFERRED EMBODIMENTS

This invention uses a hardmask for patterning of the aluminum interconnect metal etching process. It includes employment of etch gas composed mainly of boron trichloride/chlorine/fluoroform/nitrogen in aluminum copper alloy etching. It also includes the step of using water vapor plasma to remove the etch remnants. The flow chart of the invention is shown in FIG. 2.

Figure 1:
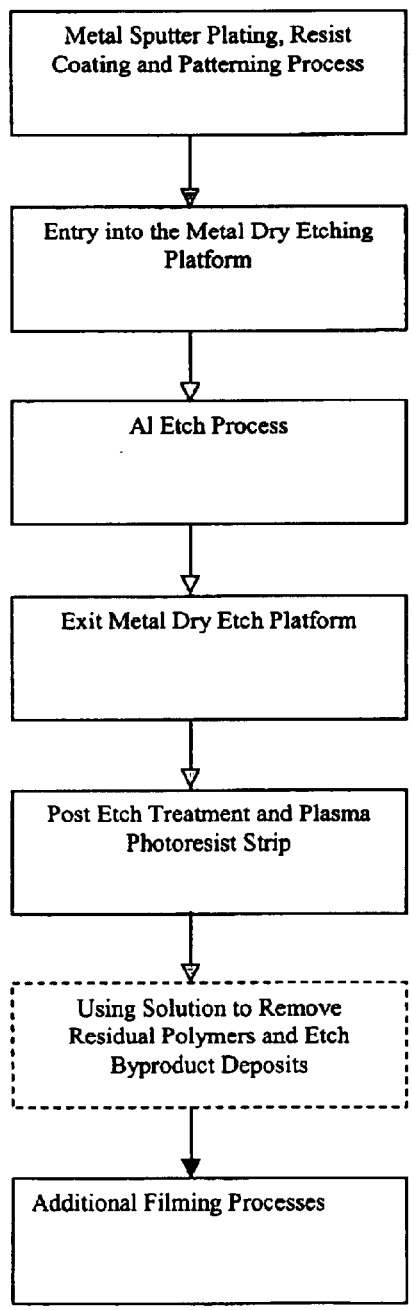
FIG. 1 illustrates a flow chart of conventional metal etching method.
Figure 2:
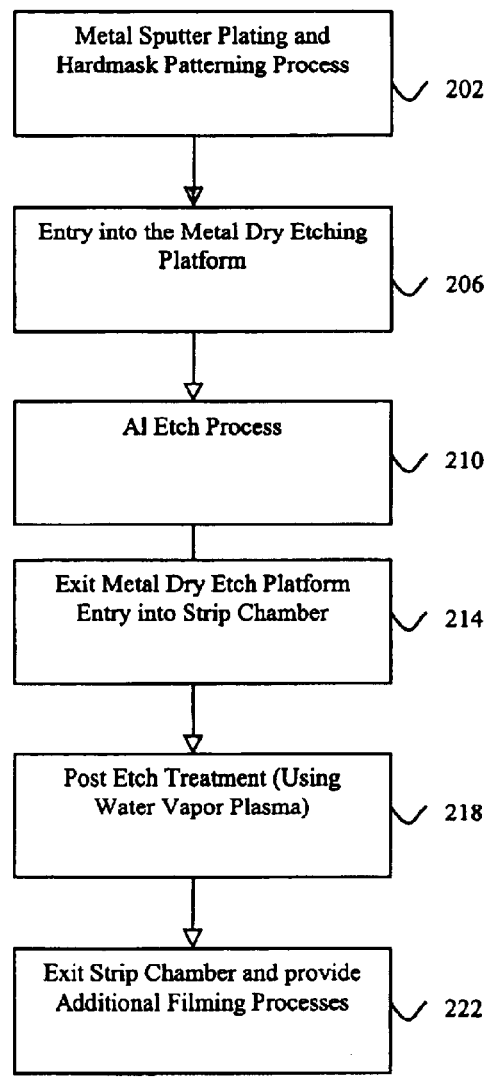
FIG. 2 illustrates a flow chart of an application of oxide hardmask aluminum interconnect etching method based one embodiment of the present invention.
Figure 4:
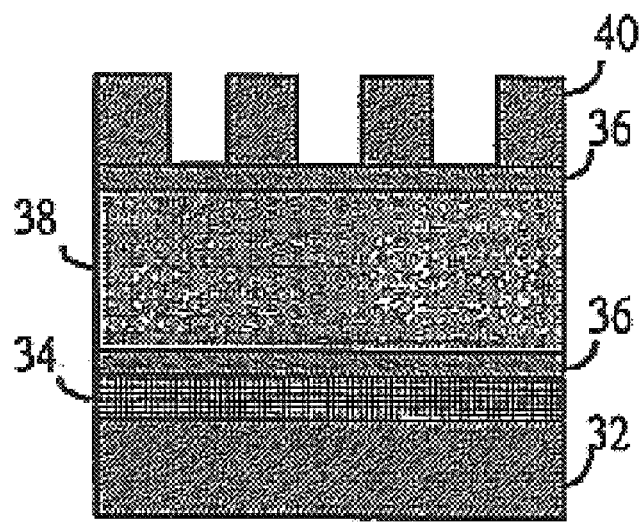
FIG. 4 illustrates a cross section of the oxide hardmask aluminum interconnect stack prior to etch based on one embodiment of the present invention.

FIG. 2 provides an operational method for etch and strip processing. In operation 202, a substrate which maybe complete with several layers of materials and devices, is provided after a metal plating process and subsequent patterning of the design by a hardmask. The interconnect design is defined by the hardmask, in contrast to the photoresist agent 40 shown in FIG. 4, that provides protection of the underlying material during the subsequent etch process. Hardmasks are designed from material that has high selectivity to the etchant gasses used in the etch process. As an example, the hardmask may one of a silicon dioxide or silicon nitride layer producing high selectivity to etch ratios for underlying material such as titanium, titanium nitride, aluminum copper alloys, aluminum and other selected materials. Next the substrate having the metal layer and the patterned hardmask is placed into a plasma etch chamber, in operation 206. In operation 210, the patterned substrate is subjected to an etch process within the plasma etch chamber. The etch process may contain several steps in which elements of pressure, gas, and power are combined in order to produce excited chemical species within the etch chamber. The excited chemical species of the etchant gas mixture, otherwise known as a plasma, contain radicals, ions, and neutrals which interact to varying degrees with exposed areas on the substrate, that is areas which are not covered and protected by a hardmask or photoresist. The interaction of elements of the plasma with the exposed material of the substrate effectively removes material in the uncovered region. The use of bias voltage provides directionality of ions accelerated toward the surface, thus providing substantial anisotropic etching. In operation 214, the substrate is removed from the etch chamber and is placed in a strip chamber. In one embodiment removal from the etch chamber and placement in the strip chamber can be accomplished in one overall system, known as a cluster tool. The cluster tool configuration provides for efficient automated movement of substrates between processing chambers. Once the substrate is placed in the heated strip chamber it is treated with by application of gasses including oxygen, nitrogen and water vapor in a pressure controlled environment excited by a power source in operation 218. Treatment in the strip chamber serves to remove both the hardmask as well as undesired materials remaining from the etch process described in operation 210. In one such application, water vapor and oxygen provide for passivation of the chemical reaction between aluminum and etchant gasses from the previous etch process, operation 210. Passivation, as used herein, describes a prevention of further chemical reaction of halogen containing etchants including chlorine and fluorine that may otherwise cause corrosion of materials including aluminum and aluminum copper alloys. Next the substrate is removed from the strip chamber and is ready for additional processing in operation 222. Additional processing may involve the application as well as the removal of additional materials in the manufacture of semiconductors.

Figure 3:
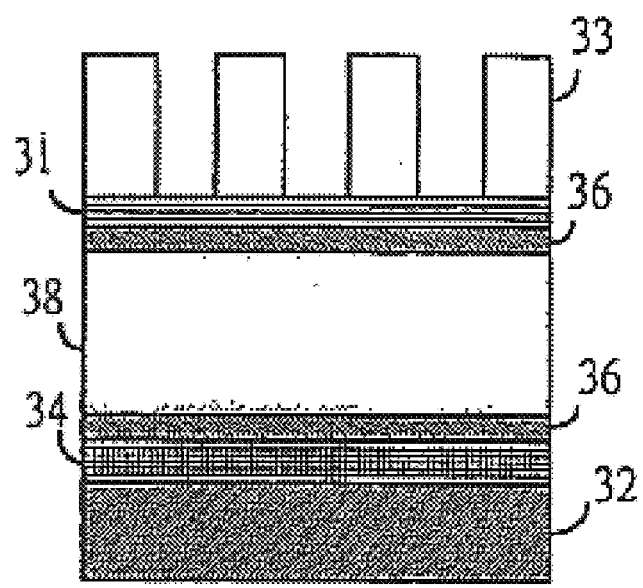
FIG. 3 illustrates a cross section of the aluminum interconnect stack prior to etch in a conventional photoresist mask method.

In this method, the mask used by the component is the hard mask, instead of the conventionally used photoresist. Comparison of the two methods is shown in FIG. 3, "The Cross-Section of the Conventionally Used Photoresist Components", and FIG. 4, "The Cross-Section of the Hardmasking Component."

After plating the metal and patterning the hardmask, the wafer is sent to an etch processor for aluminum interconnect etching. Given the poor selectivity and profile control of the conventionally used etch gases composed of chlorine ($Cl_2$), boron trichloride ($BCl_3$), and nitrogen ($N_2$) or chlorine, boron trichloride, and fluoroform ($CHF_3$), this invention uses boron trichloride ($BCl_3$), chlorine ($Cl_2$), fluoroform ($CHF_3$), and nitrogen ($N_2$) as major components for the etching gas. Etching in the reaction chamber of this step involves four main stages, namely, Breakthrough, Main Etch 1, Main Etch 2 and Over Etch. In the first step, also known as the breakthrough step, the etch chamber provides for pressure conditions between about 6 milliTorr (mT) and about 15 mT. The etch processor provides a gas mixture comprising about 80 to about 150 standard cubic centimeters per minute (sccm) chlorine, about 80 to about 150 sccm boron trichloride, about 5 to about 15 sccm nitrogen, and about 5 to 15 sccm fluoroform gas. Introduction of the gasses into the chamber at the pressure specified above increases the mean free path of the molecules, assisting in dissociation. The etch processor provides excitation of the gas molecules by applying radio-frequency power from a generator through an inductive antennae from about 400 to about 1000 watts. The etch processor provides bias voltage from about 100 to about 200 volts to aid in the directionality of ions accelerated to the surface of the substrate. The introduction of the energy into the processor coupled with the low pressure environment creates a plasma of charged chemical species that react with exposed features on the surface of the substrate. The first step proceeds for about 10 to about 25 seconds.

1. Breakthrough
   Pressure: 6–15 mT
   Plasma: 400–1000 watt TCP
   Bias Voltage: 100–200 watt
   Chlorine: 80–150 s.c.c.m.
   Boron Trichloride: 80–150 s.c.c.m.
   Nitrogen: 5–15 s.c.c.m.
   Fluoroform: 5–15 s.c.c.m.
   Time: 10–25 seconds In a second significant step, also known as the main etch step, the etch chamber provides for pressure conditions between about 6 milliTorr (mT) and about 15 mT. The etch processor provides a gas mixture comprising about 50 to about 150 sccm chlorine, about 50 to about 150 sccm boron tricholoride, about 5 to about 15 sccm nitrogen, and about 5 to 15 sccm fluoroform gas. The etch processor provides excitation of the gas molecules by applying radio-frequency power from a generator through an inductive antennae from about 400 to about 1000 watts. The etch processor provides bias voltage from about 100 to about 200 volts to aid in the directionality of ions accelerated to the surface of the substrate. The introduction of the energy into the processor creates a plasma of charged chemical species that react with exposed features on the surface of the substrate. The second step proceeds for a time to be determined by the thickness of a material to be etched, in one embodiment the material may be one of aluminum copper.

In a third significant step, also known as the main etch 2 step, the etch chamber may continue the main etch step described above to account for the amount of microloading. Microloading is a term of art used to describe the phenomena by which small exposed areas tend to etch faster than larger areas. In other words, there is an observed difference in etch rates between area having a high density of features compared to areas having a low density of features. Features having smaller geometries are less susceptible to redeposition of polymer and other byproducts of the etch reaction. Polymer and other etch byproducts may accumulate in recessed features as they are being formed during the etch process. The accumulation of redeposited material can impede the progression of the etch process, thereby extending the time that the substrate is exposed to the process conditions and in the limit producing an effect known as etch stop. Additionally, reactant concentration is reduced in high exposed areas that consume more reactant than in lower exposed areas. In main etch 2 step, the etch processor provides for pressure conditions between about 6 milliTorr (mT) and about 15 mT, and a gas mixture comprising about 50 to about 150 sccm chlorine, about 50 to about 150 sccm boron tricholoride, about 5 to about 15 sccm nitrogen, and about 5 to 15 sccm fluoroform gas. The etch processor provides power from a generator through an inductive antennae from about 400 to about 1000 watts and bias voltage from about 100 to about 200 volts in order to create a plasma and provide directionality for species involved surface interactions on the substrate.

In a fourth significant step, also known as the overetch step, the etch chamber may continue processing but provides for added selectivity of etchant to particular materials and continues for a duration determined by the etch rate of material, The etch rate is often correlated to plasma emissions monitored by the processing system. As is well known in the art, monitoring systems such as optical emission spectroscopy (OES) sensors and may provide input for algorithms designed to recognize patterns and the progression of the etch process. In the overetch step, the etch processor provides for pressure conditions between about 6 milliTorr (mT) and about 15 mT, and a gas mixture comprising about 80 to about 150 sccm chlorine, about 80 to about 150 sccm boron tricholoride, about 5 to about 15 sccm nitrogen, and about 5 to 15 sccm fluoroform gas. The etch processor provides power from a generator through an inductive antennae from about 400 to about 1000 watts and bias voltage from about 100 to about 200 volts.

After the chip goes through the metal etching process in the etch process chamber, as described above, it will be sent to a second chamber, also known as a stripper, to remove the etch byproducts, and the hardmask, as well as to passivate remaining etchant species that may still be chemically reacting with material on the substrate, thus preventing corrosion. The strip process involves three stages, namely, Warm-up, Water, and Passivation steps.

During the first step, also known as the warm-up step, the chamber should be heated to a temperature between about 200 degrees Celsius (° C.) to about 270° C. The purpose of using high pressure oxygen preheat is to prevent the corrosion of metal by the remnants of the aluminum interconnect etching process. The strip chamber regulates pressure conditions between about 7000 milliTorr (mT) and about 9000 mT while providing a mixture comprising about 1500 to about 3000 sccm oxygen gas and about 1000 to about 2000 sccm of water vapor. The first step proceeds for about 10 to about 30 seconds.

In the second step, also known as the water step, the strip chamber lowers pressure conditions to between about 2000 milliTorr (mT) and about 4000 mT while providing about 1000 to about 2000 sccm of water vapor. The second step proceeds for about 5 to about 30 seconds.

In the main step, also known as the passivation step, the strip chamber regulates pressure conditions between about 2000 milliTorr (mT) and about 4000 mT while providing a mixture comprising about 1500 to about 3000 sccm oxygen gas and about 1000 to about 2000 sccm of water vapor. Through a plasma applicator in the strip chamber, power from a radio-frequency (RF) or microwave (MW) source of about 2000 watts assists in the creation of a plasma which is applied to the substrate in order to promote passivation and removal of residues, mainly chlorine containing residues that if not removed may cause corrosion of aluminum containing interconnect lines. The non-directionality of the plasma applied to the substrate aids in reducing corrosion in areas known as sidewalls and other areas which may otherwise not receive elements of the plasma when applied with greater directionality through the use of a bias source. The passivation step proceeds for about 60 to about 90 seconds. High pressure oxygen is used to provide better heat conductivity from the chamber to the wafer. The employment of water vapor plasma will prevent chip corrosion by the etch remnants. It will also reduce the need of the conventional process for water rinsing and solution immersion and will send the chip directly into the next stage of filming. This will not only enhance the quality of the chip and save production cost, it will also shorten the production period, thus increasing productivity.

The technology and technical features of this invention have been described above. Nevertheless, those skilled in the art may, based on the principles of this invention, substitute or modify the technology. Therefore, protection of this invention should not be limited to the demonstrations shown in the case examples only, it should also cover all substitutions and modifications based on the same principles, as covered in the following patent claims.

What is claimed is:

1. A method of processing a substrate comprising:
   placing a substrate having a pattern in a processing chamber, the pattern defining interconnections on the substrate;
   providing a plasma within the processing chamber, the plasma comprising the combination of boron trichloride, chlorine, fluoroform and nitrogen gases, using the plasma to etch a film exposed on the substrate;
   removing the substrate from the processing chamber;
   placing the substrate in a second chamber; and
   processing the substrate in the second chamber under process conditions comprising;
   a first step that provides processing at conditions comprising:
      a pressure of about 7000 milliTorr (mT) to about 9000 mT;
      oxygen gas levels from about 1500 to about 3000 standard cubic centimeters (sccm); and water vapor levels from about 1000 to about 2000 sccm;

a second step that provides processing at conditions comprising:
   a pressure of about 2000 milliTorr (mT) to about 4000 mT; and
   water vapor levels from about 1000 to about 2000 sccm; and
a third passivation step that provides processing at conditions comprising:
   a pressure of about 2000 milliTorr (mT) to about 4000 mT;
   a plasma-comprising:
      a level of power about 2000 watts from one of an inductive source and a microwave source capable of producing an amount of chemical disassociation;
      oxygen gas levels from about 1500 to about 3000 standard cubic centimeters (sccm); and
      water vapor levels from about 1000 to about 2500 sccm.

2. The method of claim 1 wherein said etching of the film includes a breakthrough step, a first main etch step, a second main etch step and an over etch step.

3. The method of claim 2 wherein the breakthrough step provides processing at conditions comprising:
   a pressure of about 6 milliTorr (mT) to about 15 mT;
   a plasma comprising:
      a level of radio-frequency (RF) power from about 400 watts to about 1000 watts from an inductive source capable of producing an amount of chemical disassociation;
      a level of bias voltage from about 100 to about 200 volts;
      excited species of gasses derived from
         chlorine gas levels from about 80 to about 150 standard cubic centimeters (sccm);
         boron trichloride gas levels from about 80 to about 150 s.c.c.m.;
         nitrogen gas levels from about 5 to about 15 s.c.c.m.;
         fluoroform gas levels from about 5 to about 15 s.c.c.m.

4. The method of claim 2 wherein the first main etch step provides processing at conditions comprising:
   a pressure of about 6 milliTorr (mT) to about 15 mT;
   a plasma comprising:
      a level of radio-frequency (RF) power from about 400 watts to about 1000 watts from an inductive source capable of producing an amount of chemical disassociation;
      a level of bias voltage from about 100 to about 200 volts;
      excited species of gasses derived from
         chlorine gas levels from about 50 to about 150 standard cubic centimeters (sccm);
         boron trichloride: gas levels from about 50 to about 150 s.c.c.m.;
         nitrogen gas levels from about 5 to about 15 s.c.c.m.;
         fluoroform gas levels from about 5 to about 15 s.c.c.m.;
   for a time to be determined by the thickness of the film exposed on the substrate.

5. The method of claim 2 wherein the second main etch step provides processing at conditions comprising:
   a pressure of about 6 milliTorr (mT) to about 15 mT;
   a plasma-comprising:
      a level of radio-frequency (RF) power from about 400 watts to about 1000 watts from an inductive source capable of producing an amount of chemical disassociation;
      a level of bias voltage from about 100 to about 200 volts;
      excited species of gasses derived from
         chlorine gas levels from about 50 to about 150 standard cubic centimeters (sccm);
         boron trichloride gas levels from about 50 to about 150 sccm.;
         nitrogen gas levels from about 5 to about 15 sccm.;
         fluoroform gas levels from about 5 to about 15 sccm.;
   for a time to be determined by the amount of microloading.

6. The method of claim 2 wherein the overetchstep provides processing at conditions comprising:
   a pressure of about 6 milliTorr (mT) to about 15 mT;
   a plasma-comprising:
      a level of radio-frequency (RE) power from about 400 watts to about 1000 watts from an inductive source capable of producing an amount of chemical disassociation;
      a level of bias voltage from about 100 to about 200 volts;
      excited species of gasses derived from;
         chlorine gas levels from about 50 to about 150 standard cubic centimeters (sccm);
         boron trichloride gas levels from about 50 to about 150 sccm.;
         nitrogen gas levels from about 5 to about 15 sccm;
         fluoroform gas levels from about 5 to about 15 sccm.;
   for a time to be determined by an etch rate.

7. The method of claim 1 wherein the pattern is defined on the substrate by one of a hardmask and mask.

8. The method of claim 1, wherein the interconnections on the substrate is one of aluminum, aluminum copper alloy, copper, and titanium.

9. The method of claim 1, wherein the material exposed on the substrate in the processing chamber is one of siliconoxynitride, silicon dioxide, titanium nitride, titanium, aluminum, aluminum copper alloy, and copper.

* * * * *